US009831471B2

(12) United States Patent
Matsunaga et al.

(10) Patent No.: US 9,831,471 B2
(45) Date of Patent: Nov. 28, 2017

(54) METHOD FOR PRODUCING ORGANIC ELECTROLUMINESCENT DISPLAY PANEL

(71) Applicant: Sharp Kabushiki Kaisha, Osaka-shi (JP)

(72) Inventors: Kazuki Matsunaga, Osaka (JP); Katsuhiro Kikuchi, Osaka (JP); Shinichi Kawato, Osaka (JP); Satoshi Inoue, Osaka (JP); Yuhki Kobayashi, Osaka (JP); Takashi Ochi, Osaka (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 0 days.

(21) Appl. No.: 15/101,285

(22) PCT Filed: Sep. 17, 2014

(86) PCT No.: PCT/JP2014/074474
§ 371 (c)(1),
(2) Date: Jun. 2, 2016

(87) PCT Pub. No.: WO2015/083412
PCT Pub. Date: Jun. 11, 2015

(65) Prior Publication Data
US 2017/0033322 A1    Feb. 2, 2017

(30) Foreign Application Priority Data
Dec. 4, 2013    (JP) .................................. 2013-251276

(51) Int. Cl.
*H01L 51/00*    (2006.01)
*H01L 51/56*    (2006.01)
(Continued)

(52) U.S. Cl.
CPC .......... *H01L 51/56* (2013.01); *H01L 27/3211* (2013.01); *H01L 51/0017* (2013.01); *H01L 51/5012* (2013.01)

(58) Field of Classification Search
None
See application file for complete search history.

(56) References Cited

U.S. PATENT DOCUMENTS

| 2012/0028469 A1* | 2/2012 | Onizawa ............... C23C 16/345 |
| | | 438/694 |
| 2012/0302070 A1* | 11/2012 | Lin ........................... C23F 4/00 |
| | | 438/710 |

(Continued)

FOREIGN PATENT DOCUMENTS

| JP | 2004-205911 | 7/2004 |
| JP | 2007-66562 | 3/2007 |

OTHER PUBLICATIONS

International Search Report dated Nov. 4, 2014, directed to International Application No. PCT/JP2014/074474; 2 pages.

*Primary Examiner* — Jay C Chang
(74) *Attorney, Agent, or Firm* — Morrison & Foerster LLP

(57) ABSTRACT

The method for producing an organic EL display panel includes, in the given order, the steps of: forming a first light-emitting layer by forming a film from a luminescent material of a first luminescent color in a first pixel; performing the etching treatment to remove, while leaving the first light-emitting layer to remain, a thin film of the luminescent material of the first luminescent color which adhered to the second pixel in the step; forming a second light-emitting layer by forming a film from a luminescent material of a second luminescent color different from the first luminescent color in the second pixel; and performing the etching treatment to remove, while leaving the second light-emitting (Continued)

layer to remain, a thin film of the luminescent material of the second luminescent color which adhered to the first pixel in the step.

9 Claims, 7 Drawing Sheets

(51) Int. Cl.
*H01L 27/32* (2006.01)
*H01L 51/50* (2006.01)

(56) References Cited

U.S. PATENT DOCUMENTS

2013/0075768 A1* 3/2013 Kim .................... H01L 51/0016
 257/88
2013/0302572 A1* 11/2013 Sonoda ............... H01L 27/3211
 428/172

* cited by examiner (a)

(b)

(c)

METHOD FOR PRODUCING ORGANIC ELECTROLUMINESCENT DISPLAY PANEL

CROSS-REFERENCE TO RELATED APPLICATIONS

This application is a U.S. National Phase patent application of International Patent Application No. PCT/JP2014/074474, filed on Sep. 17, 2014, which claims priority to Japanese Application No. 2013-251276, filed on Dec. 4, 2013, each of which is hereby incorporated by reference in the present disclosure in its entirety.

FIELD OF THE INVENTION

The present invention relates to methods for producing organic electroluminescent display panels (hereinafter, also referred to as "organic EL display panels"). The present invention more specifically relates to a method for producing an organic EL display panel including light-emitting layers wherein the luminescent colors of adjacent light-emitting layers are different from each other.

BACKGROUND OF THE INVENTION

Organic electroluminescent elements (hereinafter, also referred to as "organic EL elements") utilizing electroluminescence of organic materials have drawn attention as display elements used for thin display devices. Organic EL elements emit light by recombining holes injected from the anode and electrons injected from the cathode within a light-emitting layer disposed between these electrodes. Such self-luminous organic EL elements have advantages such as high-luminance light emission, a high response speed, a wide viewing angle, a thin profile, and a light weight, and are therefore expected to be applied to various fields such as display panels and illumination lamps.

Known color organic EL display panels have a structure including light-emitting layers of red (R), green (G), and blue (B) luminescent colors, and provide images by selectively allowing these light-emitting layers to emit light with the desired luminance. These light-emitting layers may be formed such that the luminescent colors of the adjacent light-emitting layers are different from each other. Methods for forming light-emitting layers which improve the display quality of such a structure have been studied. Examples of the methods include the following methods.

Patent Literature 1, for example, discloses a method for producing a display device, including a repair step of removing or electrically insulating a color mixture part where the adjacent light-emitting layers overlap each other.

Patent Literature 2, for example, discloses a drawing operation line performing, after application of a functional liquid, an ashing treatment that removes a solvent of the functional liquid left sticking on the bank part with a plasma type surface treating device.

CITATION LIST

Patent Literature 1: JP 2007-66562 A
Patent Literature 2: JP 2004-205911 A

SUMMARY OF THE INVENTION

In production of organic EL display panels providing display with multiple luminescent colors, the light-emitting layers may be formed by separately vapor-depositing or applying luminescent materials of the respective luminescent colors to the respective pixels. The vapor deposition technique in such a case is, for example, differently vapor-depositing the luminescent materials of the respective luminescent colors using a mask in which multiple openings are formed. In particular, a vapor deposition apparatus as illustrated in FIG. 6, for example, has been used for production of large-sized organic EL display panels.

FIG. 6 is a schematic view illustrating one example of a conventional vapor deposition apparatus. As illustrated in FIG. 6, a conventional vapor deposition apparatus 111 includes, in the order toward a substrate 2, a vapor deposition source 113 provided with nozzles 112 configured to eject vapor deposition particles; a limiting plate 115 provided with openings 114a which are formed in a stripe pattern; and a mask 116 provided with openings 114b which are formed in a stripe pattern. Vapor deposition particles ejected from the nozzles 112 of the vapor deposition source 113 form vapor deposition streams 117 to pass through the openings 114a of the limiting plate 115 and the openings 114b of the mask 116, so that the particles are vapor-deposited on the predetermined positions on the substrate 2. In this configuration, the light-emitting layers are formed by sequentially vapor-depositing the luminescent materials of the respective luminescent colors while adjusting the positions of the nozzles 112 of the vapor deposition source 113, the openings 114a of the limiting plate 115, and the openings 114b of the mask 116 and relatively moving the substrate 2 or the vapor deposition apparatus 111 in the directions of the double-headed arrow.

This vapor deposition technique, however, may cause disadvantages of color mixture between adjacent pixels and deterioration of the display quality. These disadvantages are presumably caused by the following phenomena (A) and (B).

(A) Due to the factors such as misalignment of the substrate and the mask, vapor deposition particles of a luminescent material of the luminescent color for the target pixels may be scattered to the adjacent pixels of the target pixels.

(B) Due to collision and scattering of the vapor deposition particles, vapor deposition particles of a luminescent material of the luminescent color for the target pixels may be scattered to the adjacent pixels of the target pixels.

The above phenomena (A) and (B) are described below with reference to an example of a conventional method for producing an organic EL display panel provided with light-emitting layers of luminescent colors R, G, and B.

FIG. 7 is a schematic cross-sectional view illustrating the steps (steps a to c) of forming light-emitting layers in conventional production of an organic EL display panel. As illustrated in the step (a) of FIG. 7, anodes 5 and an edge cover 6 designed to cover the edges of the anodes 5 are formed on the substrate 2 in advance. The edge cover 6 is provided with openings which correspond to the respective light-emitting regions in pixels 4R, 4G, and 4B. On each of the anodes 5 are formed sequentially a hole injection layer 7 and a hole transport layer 8. In the pixel 4R of this configuration, as illustrated in the step (a) of FIG. 7, a luminescent material of the luminescent color R is vapor-deposited such that a light-emitting layer 9R is first formed. At this time, due to the above phenomena (A) and (B), a thin film 10R of the luminescent material of the luminescent color R, which is thinner than the light-emitting layer 9R, may adhere to the pixels 4G and 4B and the entire region on the edge cover 6.

Next, as illustrated in the step (b) of FIG. 7, a luminescent material of the luminescent color G is vapor-deposited in the pixel 4G such that a light-emitting layer 9G is formed. At this time, due to the above phenomena (A) and (B), a thin film 10G of the luminescent material of the luminescent color G, which is thinner than the light-emitting layer 9G, may adhere to the pixels 4R and 4B and on the entire region on the thin film 10R.

Next, as illustrated in the step (c) of FIG. 7, a luminescent material of the luminescent color B is vapor-deposited in the pixel 4B such that a light-emitting layer 9B is formed. At this time, due to the above phenomena (A) and (B), a thin film 10B of the luminescent material of the luminescent color B, which is thinner than the light-emitting layer 9B, may adhere to the pixels 4R and 4G and the entire region on the thin film 10G.

Then, components such as cathodes (not illustrated) facing the anodes 5 are appropriately formed, whereby an organic EL display panel 101 including organic EL elements 103 formed on the substrate 2 is obtained. The organic EL display panel 101, however, may exhibit a deteriorated display quality because the thin films 10R, 10G, and 10B may unfortunately cause color mixture between adjacent pixels, failing to provide the desired luminescent colors. It is possible to reduce the thicknesses and distributed regions of the thin films 10R, 10G, and 10B by changing the vapor deposition conditions or narrowing the distance between the substrate and the mask, for suppressing formation of the thin films 10R, 10G, and 10B. Yet, the thin films have not been eliminated completely.

Accordingly, the conventional methods for producing an organic EL display panel can still be improved from the viewpoint of preventing color mixture and improving the display quality.

Patent Literature 1 discloses that it provides a method for producing a display device with favorable display quality. The invention described in Patent Literature 1, however, is intended to repair (remove or insulate electrically) only the color mixture parts where the adjacent light-emitting layers overlap each other. The invention described in Patent Literature 1 therefore cannot eliminate the thin films 10R, 10G, and 10B formed in the entire regions of the respective pixels as illustrated in the step (c) of FIG. 7, which means that the invention can still be improved in terms of this problem. The invention described in Patent Literature 1 also requires an inspection step of determining the amounts and positions of the color mixture parts, and thus can still be improved in terms of the improvement of the production efficiency. Furthermore, since the color mixture parts are repaired after the organic EL elements are formed in the invention described in Patent Literature 1, the residues generated in the repair may cause leakage between the anode and the cathode.

Patent Literature 2 discloses that it provides a drawing operation line that is configured to prevent color mixture caused by a solvent left sticking on the bank part. The invention described in Patent Literature 2, however, focuses on the solvent of the functional liquid left sticking on the bank part, not the thin films 10R, 10G, and 10B formed in the entire regions of the respective pixels as illustrated in the step (c) of FIG. 7, which means that the invention can still be improved in terms of this problem. Also, in the case of removing the color mixture parts by the invention described in Patent Literature 2, an inspection step of determining the amounts and positions of the color mixture parts is required, and the processing conditions presumably need to be changed based on the information obtained from the inspection step. The invention therefore can still be improved in terms of the improvement of the production efficiency.

The present invention was made in view of the current state of the art, and aims to provide a method for producing an organic EL display panel which can prevent color mixture, improve the display quality, and improve the production efficiency.

The inventors made various studies on methods for producing organic EL display panels which can prevent color mixture, improve the display quality, and improve the production efficiency. The inventors have then focused on the etching treatment, after formation of a light-emitting layer in a predetermined pixel, on a region including pixel(s) adjacent to the predetermined pixel. The inventors found that by removing the thin film adhering to the entire region of each adjacent pixel while leaving the light-emitting layer to remain in the predetermined pixel, color mixture can be prevented even when a light-emitting layer is formed thereafter in the adjacent pixel. Also, since the entire region including the adjacent pixels is etched, a selective etching treatment with a tool such as a mask and an advanced alignment technique for the selective etching treatment are not necessary. Furthermore, an inspection step of determining the conditions such as the positions of the portions to be etched can be eliminated. Hence, the inventors have found that the production efficiency can be improved. The inventors thereby arrived at the present invention which can solve the above problems.

That is, one aspect of the present invention may be a method for producing an organic electroluminescent display panel, which forms a first light-emitting layer of a luminescent material of a first luminescent color in a first pixel and forms a second light-emitting layer of a luminescent material of a second luminescent color different from the first luminescent color in a second pixel adjacent to the first pixel, the method including, in the given order, the steps of: (1) forming the first light-emitting layer by forming a film from the luminescent material of the first luminescent color in the first pixel; (2) performing the etching treatment to a region including the first and second pixels to remove, while leaving the first light-emitting layer to remain, a thin film of the luminescent material of the first luminescent color which adhered to the second pixel in the step (1) and is thinner than the first light-emitting layer; (3) forming the second light-emitting layer by forming a film from the luminescent material of the second luminescent color in the second pixel; and (4) performing the etching treatment to a region including the first and second pixels to remove, while leaving the second light-emitting layer to remain, a thin film of the luminescent material of the second luminescent color which adhered to the first pixel in the step (3) and is thinner than the second light-emitting layer.

The present invention can provide a method for producing an organic EL display panel which can prevent color mixture, improve the display quality, and improve the production efficiency.

DETAILED DESCRIPTION OF THE INVENTION

The present invention will be described in more detail below with reference to the drawings based on embodiments which, however, are not intended to limit the scope of the present invention. The configurations of the embodiments may be combined or altered within the spirit of the present invention.

The following embodiments relate to methods for producing an organic EL display panel including light-emitting layers of luminescent colors R, G, and B, and describe the methods of sequentially forming light-emitting layers of the luminescent color R, light-emitting layers of the luminescent color G, and light-emitting layers of the luminescent color B. Here, the kinds and number of the luminescent colors and the order of forming the light-emitting layers are not particularly limited.

Organic electroluminescence as used herein is also referred to as "organic EL". Organic EL is also called an organic light emitting diode (OLED).

Embodiment 1 describes the case of performing the vapor deposition and the etching treatment for the luminescent material of each luminescent color in the same chamber.

Figure 1:
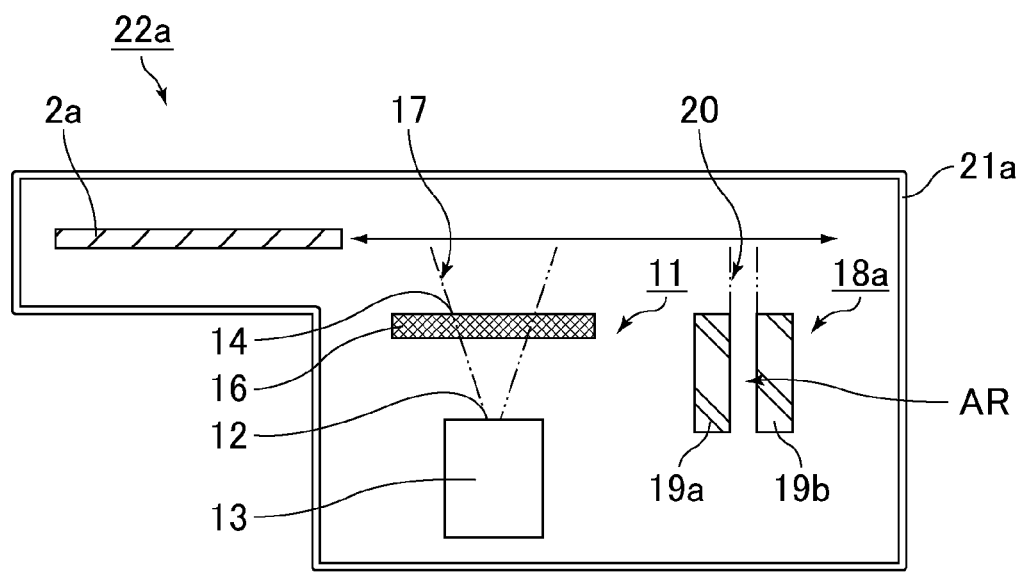
FIG. 1 is a schematic cross-sectional view illustrating an apparatus unit used in the step of forming light-emitting layers in production of an organic EL display panel of Embodiment 1.

First, the configuration of an apparatus unit used in the step of forming light-emitting layers is described with reference to FIG. 1. FIG. 1 is a schematic cross-sectional view illustrating an apparatus unit used in the step of forming light-emitting layers in production of an organic EL display panel of Embodiment 1. As illustrated in FIG. 1, an apparatus unit 22a used in the step of forming light-emitting layers includes a vapor deposition apparatus 11 and a plasma treatment apparatus 18a. The vapor deposition apparatus 11 and the plasma treatment apparatus 18a are disposed, in the given order, in a chamber 21a.

The vapor deposition apparatus 11 includes a vapor deposition source 13 provided with nozzles 12 configured to eject vapor deposition particles, and a mask 16 provided with openings 14. A limiting plate provided with openings may be appropriately disposed between the vapor deposition source 13 and the mask 16. Vapor deposition particles ejected from the nozzles 12 of the vapor deposition source 13 form vapor deposition streams 17 to pass through the openings 14 of the mask 16, so that the particles are vapor-deposited at the predetermined positions on a target substrate 2a.

The plasma treatment apparatus 18a includes a pair of electrodes 19a and 19b, and is configured to perform the etching treatment sequentially from one end to the other end of the substrate after the vapor deposition, by irradiating the substrate with plasma 20 from an electric discharge space AR formed by electric discharge between the pair of electrodes. As a result, the entire surface of the substrate after the vapor deposition is etched.

By performing the respective treatments (vapor deposition and etching) while moving the target substrate 2a in the directions of the arrow in the apparatus unit 22a, light-emitting layers are formed. There are three apparatus units 22a for the respective luminescent colors. Sequentially performing the treatments in these three apparatus units, i.e., alternately performing the vapor deposition and the etching treatment three times, enables formation of light-emitting layers of three (R, G, B) luminescent colors.

Figure 2:
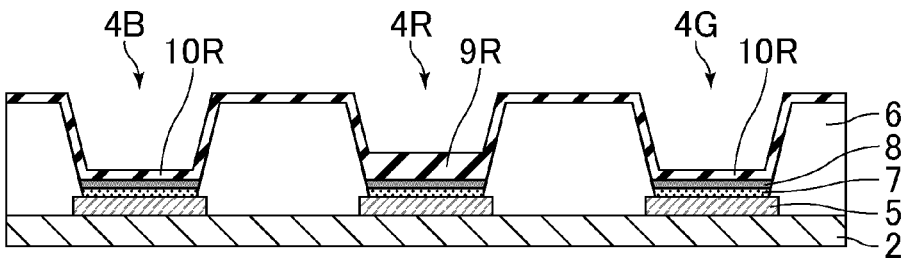
FIG. 2 is a schematic cross-sectional view illustrating steps (steps a to f) of forming light-emitting layers in the production of the organic EL display panel of Embodiment 1.
Figure 2:
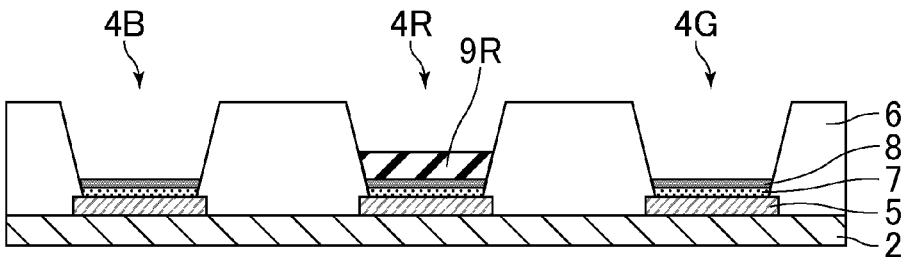
Figure 2:
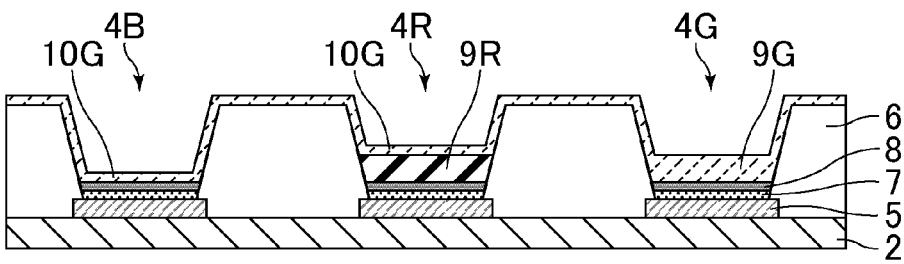
Figure 2:
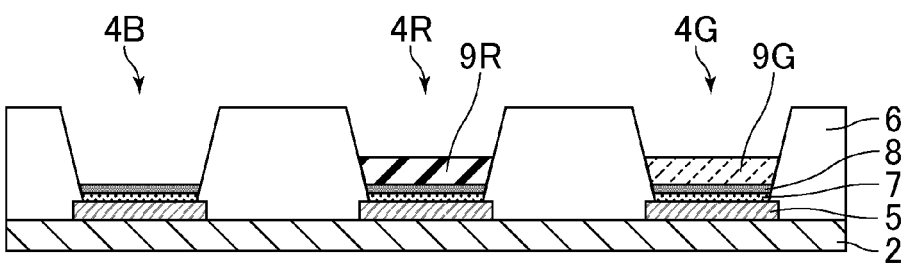
Figure 2:
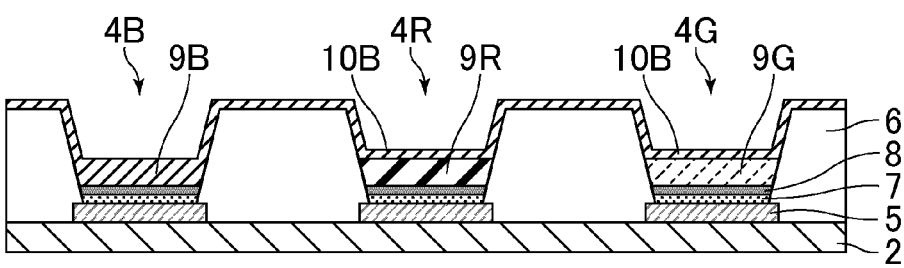
Figure 2:
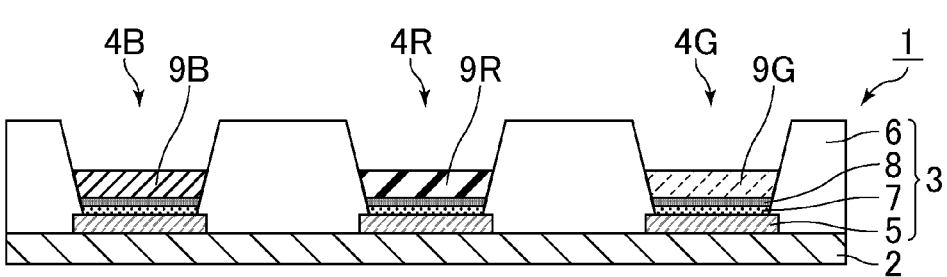

Next, the flow of the step of forming light-emitting layers is described with reference to FIG. 2. FIG. 2 is a schematic cross-sectional view illustrating steps (steps a to f) of forming light-emitting layers in the production of the organic EL display panel of Embodiment 1. Although three pixels (4R, 4G, 4B) are enlarged in FIG. 2, such configurations are repeatedly formed in the left-right direction.

(a) Vapor Deposition of Luminescent Material of Luminescent Color R

As illustrated in the step (a) of FIG. 2, the anodes 5 and the edge cover 6 covering the ends of the anodes 5 are formed on the substrate 2 in advance. The edge cover 6 is provided with openings which correspond to the respective light-emitting regions of the pixels 4R, 4G, and 4B. On each of the anodes 5 are formed sequentially the hole injection layer 7 and the hole transport layer 8. As illustrated in the step (a) of FIG. 2, in the pixel 4R of this configuration, the luminescent material of the luminescent color R is vapor-deposited using the vapor deposition apparatus 11 as already described with reference to FIG. 1 such that the light-emitting layer 9R is formed. At this time, due to the above phenomena (A) and (B), the thin film 10R of the luminescent material of the luminescent color R, which is thinner than the light-emitting layer 9R, adheres to the pixels 4G and 4B and the entire region on the edge cover 6. Here, the region where the thin film 10R is formed may vary depending on the vapor deposition conditions. For example, the thin film 10R may not reach the edge cover 6 to the right of the pixel 4G or the edge cover 6 to the left of the pixel 4B.

Although the thickness of the thin film 10R is different depending on the kind of the luminescent material of the luminescent color R and the vapor deposition conditions thereof, the thickness of the thin film 10R may be 0.4 nm in the case that the thickness of the light-emitting layer 9R is 40 nm, for example.

(b) Etching Treatment after Step (a)

Using the plasma treatment apparatus 18a as already described with reference to FIG. 1, the entire surface of the substrate after the step (a) is etched to remove the thin film 10R while leaving the light-emitting layer 9R to remain as illustrated in the step (b) of FIG. 2. At this time, the thickness to be removed by the etching treatment preferably corresponds to the thickness of the thin film 10R. Thereby, the influence of the etching treatment on the light-emitting layer 9R can be minimized. Here, since the entire surface of the substrate after the step (a) is etched, a selective etching treatment with a tool such as a mask and the inspection step of determining the conditions such as the positions of the portions to be etched are not necessary. Therefore, the production efficiency can be improved. The etching treatment conditions can be appropriately set in accordance with the kind of the luminescent material of the luminescent color R and the vapor deposition conditions thereof. Preferred conditions here are, for example, that the gas used is oxygen ($O_2$), the frequency of the radio frequency (RF) is 13.56 MHz, the output is 100 W, and the treatment time is 30 seconds or shorter.

(c) Vapor Deposition of Luminescent Material of Luminescent Color G

As illustrated in the step (c) of FIG. 2, in the pixel 4G, the luminescent material of the luminescent color G is vapor-deposited using the vapor deposition apparatus 11 as already described with reference to FIG. 1 such that the light-emitting layer 9G is formed. At this time, due to the above phenomena (A) and (B), the thin film 10G of the luminescent material of the luminescent color G, which is thinner than the light-emitting layer 9G, adheres to the pixels 4R and 4B and the entire region on the edge cover 6. Here, the region where the thin film 10G is formed may vary depending on the vapor deposition conditions. For example, the thin film 10G may not reach the edge cover 6 between the pixel 4R and the pixel 4B.

Although the thickness of the thin film 10G is different depending on the kind of the luminescent material of the luminescent color G and the vapor deposition conditions thereof, the thickness of the thin film 10G may be 0.4 nm in the case that the thickness of the light-emitting layer 9G is 40 nm, for example.

(d) Etching Treatment after Step (c)

Using the plasma treatment apparatus 18a as already described with reference to FIG. 1, the entire surface of the substrate after the step (c) is etched to remove the thin film 10G while leaving the light-emitting layer 9G to remain as illustrated in the step (d) of FIG. 2. At this time, the thickness to be removed by the etching treatment preferably corresponds to the thickness of the thin film 10G. Thereby, the influence of the etching treatment on the light-emitting layer 9G can be minimized. Here, since the entire surface of the substrate after the step (c) is etched, a selective etching treatment with a tool such as a mask and the inspection step of determining the conditions such as the positions of the portions to be etched are not necessary. Therefore, the production efficiency can be improved. The etching treatment conditions can be appropriately set in accordance with the kind of the luminescent material of the luminescent color G and the vapor deposition conditions thereof. Preferred conditions here are, for example, that the gas used is $O_2$, the frequency of RF is 13.56 MHz, the output is 100 W, and the treatment time is 30 seconds or shorter.

(e) Vapor Deposition of Luminescent Material of Luminescent Color B

As illustrated in the step (e) of FIG. 2, the luminescent material of the luminescent color B is vapor-deposited in the pixel 4B using the vapor deposition apparatus 11 as already described with reference to FIG. 1, such that the light-emitting layer 9B is formed. At this time, due to the above phenomena (A) and (B), the thin film 10B of the luminescent material of the luminescent color B, which is thinner than the light-emitting layer 9B, adheres to the pixels 4R and 4G and the entire region on the edge cover 6. Here, the region where the thin film 10B is formed may vary depending on the vapor deposition conditions. For example, the thin film 10B may not reach the edge cover 6 between the pixel 4R and the pixel 4G.

Although the thickness of the thin film 10B is different depending on the kind of the luminescent material of the luminescent color B and the vapor deposition conditions thereof, the thickness of the thin film 10B may be 0.4 nm in the case that the thickness of the light-emitting layer 9B is 40 nm, for example.

(f) Etching Treatment after Step (e)

Using the plasma treatment apparatus 18a as already described with reference to FIG. 1, the entire surface of the substrate after the step (e) is etched to remove the thin film 10B while leaving the light-emitting layer 9B to remain as illustrated in the step (f) of FIG. 2. At this time, the thickness to be removed by the etching treatment preferably corresponds to the thickness of the thin film 10B. Thereby, the influence of the etching treatment on the light-emitting layer 9B can be minimized. Here, since the entire surface of the substrate after the step (e) is etched, a selective etching treatment with a tool such as a mask and the inspection step of determining the conditions such as the positions of the portions to be etched are not necessary. Therefore, the production efficiency can be improved. The etching treatment conditions can be appropriately set in accordance with the kind of the luminescent material of the luminescent color B and the vapor deposition conditions thereof. Preferred conditions here are, for example, that the gas used is $O_2$, the frequency of RF is 13.56 MHz, the output is 100 W, and the treatment time is 30 seconds or shorter.

Thereafter, layers such as an electron transport layer (not illustrated), an electron injection layer (not illustrated), and a cathode (not illustrated) are appropriately sequentially formed on each light-emitting layer, whereby an organic EL display panel 1 including organic EL elements 3 formed on the substrate 2 is obtained. As illustrated in the step (f) of FIG. 2, in the organic EL display panel 1, the desired luminescent colors are obtained without color mixture between the adjacent pixels, so that the display quality can be improved.

As described above, the method for producing the organic EL display panel of Embodiment 1 can prevent color mixture, improve the display quality, and improve the production efficiency.

Examples of the luminescent materials of the luminescent colors R, G, and B include anthracene, naphthalene, indene, phenanthrene, pyrene, naphthacene, triphenylene, perylene, picene, fluoranthene, acephenanthrylene, pentaphene, pentacene, coronene, butadiene, coumarin, acridine, stilbene, and derivatives thereof; tris(8-quinolinolato)aluminum complex; bis(benzoquinolinolato)beryllium complex; tri(dibenzoylmethyl)phenanthroline europium complex; and ditolyl vinyl biphenyl.

Although three apparatus units 22a as illustrated in FIG. 1 are used in Embodiment 1, this configuration is not particularly limited. As a modified example, three vapor deposition apparatuses 11 and three plasma treatment apparatuses 18a may alternately be disposed in the same chamber. The shape of the chamber 21a is not particularly limited either.

Although in Embodiment 1, the anodes 5, the hole injection layers 7, and the hole transport layers 8 are sequentially formed on the substrate 2 before the light-emitting layers are formed, any other configuration may be employed. For example, cathodes, electron injection layers, and electron transport layers may be formed on the substrate 2 before the light-emitting layers are formed. The substrate 2 may be, for example, an active matrix substrate including thin-film transistors, or a transparent substrate. In the case of using a bendable plastic substrate as the transparent substrate, a flexible organic EL display panel can be obtained.

Embodiment 2 describes the case where the vapor deposition and the etching treatment of the luminescent materials are performed in separate chambers. Embodiment 2 is the same as Embodiment 1 except for the configuration of the apparatus unit used in the step of forming light-emitting layers. Hence, the same points are not described here.

Figure 3:
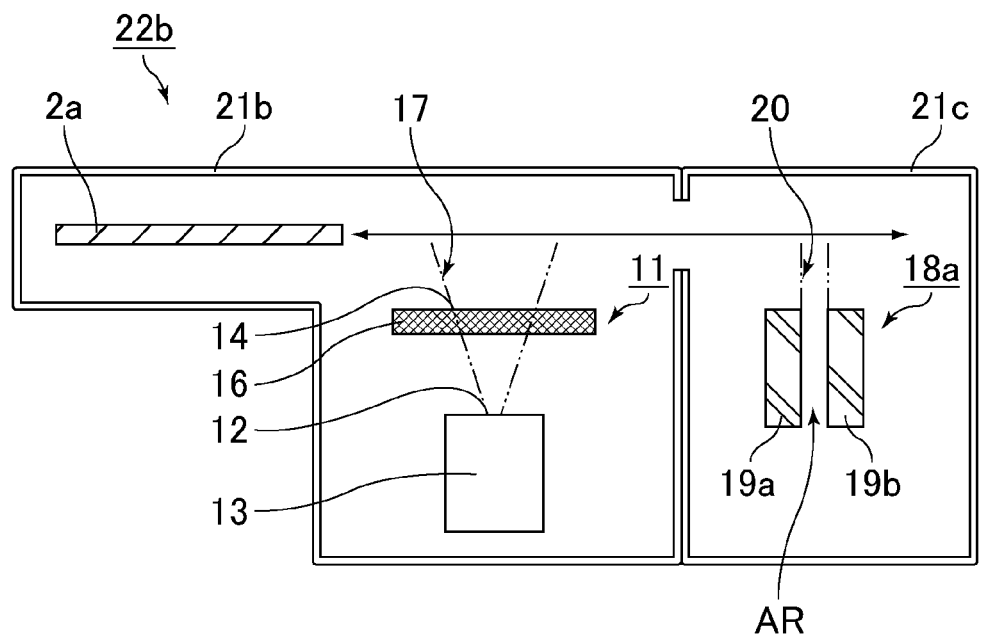
FIG. 3 is a schematic cross-sectional view illustrating an apparatus unit used in the step of forming light-emitting layers in production of an organic EL display panel of Embodiment 2.

FIG. 3 is a schematic cross-sectional view illustrating an apparatus unit used in the step of forming light-emitting layers in production of an organic EL display panel of Embodiment 2. As illustrated in FIG. 3, an apparatus unit 22b used in the step of forming light-emitting layers includes the vapor deposition apparatus 11 and the plasma treatment apparatus 18a. The vapor deposition apparatus 11 and the plasma treatment apparatus 18a are disposed respectively in chambers 21b and 21c. The chambers 21b and 21c are divided by a shutter (not illustrated), for example, so that the apparatus unit 22b can move the target substrate 2a between the chambers 21b and 21c without allowing the substrate to be out of the chambers. By performing the respective treatments (vapor deposition and etching) while moving the target substrate 2a in the directions of the arrow in the apparatus unit 22b, light-emitting layers are formed. There are three apparatus units 22b for the respective luminescent colors. Sequentially performing the treatments in these three apparatus units, i.e., alternately performing the vapor deposition and the etching treatment three times, enables formation of light-emitting layers of three (R, G, B) luminescent colors.

Since the flow of the step of forming light-emitting layers here is the same as that in Embodiment 1, the method for producing an organic EL display panel of Embodiment 2 of course achieves the effects of the present invention. As well as those effects, the method for producing the organic EL display panel of Embodiment 2 can further achieve the following additional effects.

In each of the apparatus units used in the step of forming light-emitting layers, the vapor deposition streams 17 may be influenced by the process gas from the plasma treatment apparatus 18a and it may thus be difficult to form light-emitting layers in the predetermined pixels, depending on the configuration of the vapor deposition apparatus 11. Since the method for producing the organic EL display panel of Embodiment 2 performs the vapor deposition and the etching treatment in separate chambers, vapor deposition can be performed without an influence from the plasma treatment apparatus 18a.

Although Embodiment 2 employs a configuration in which the target substrate 2a is moved between the chambers 21b and 21c without being allowed to be out of the chambers, the configuration is not particularly limited. For example, in the case of disposing two chambers apart from each other and moving the target substrate between these chambers, the substrate may be allowed to be out of the chambers.

Embodiment 3 describes the case where the etching treatment for the vapor-deposited luminescent material of the luminescent color R and the vapor deposition of the luminescent material of the luminescent color G are performed in the same chamber, while the etching treatment for the vapor-deposited luminescent material of the luminescent color G and the vapor deposition of the luminescent material of the luminescent color B are performed in the same chamber. Embodiment 3 is the same as Embodiment 1 except for the configuration of the apparatus unit used in the step of forming light-emitting layers. Hence, the same points are not described here.

Figure 4:
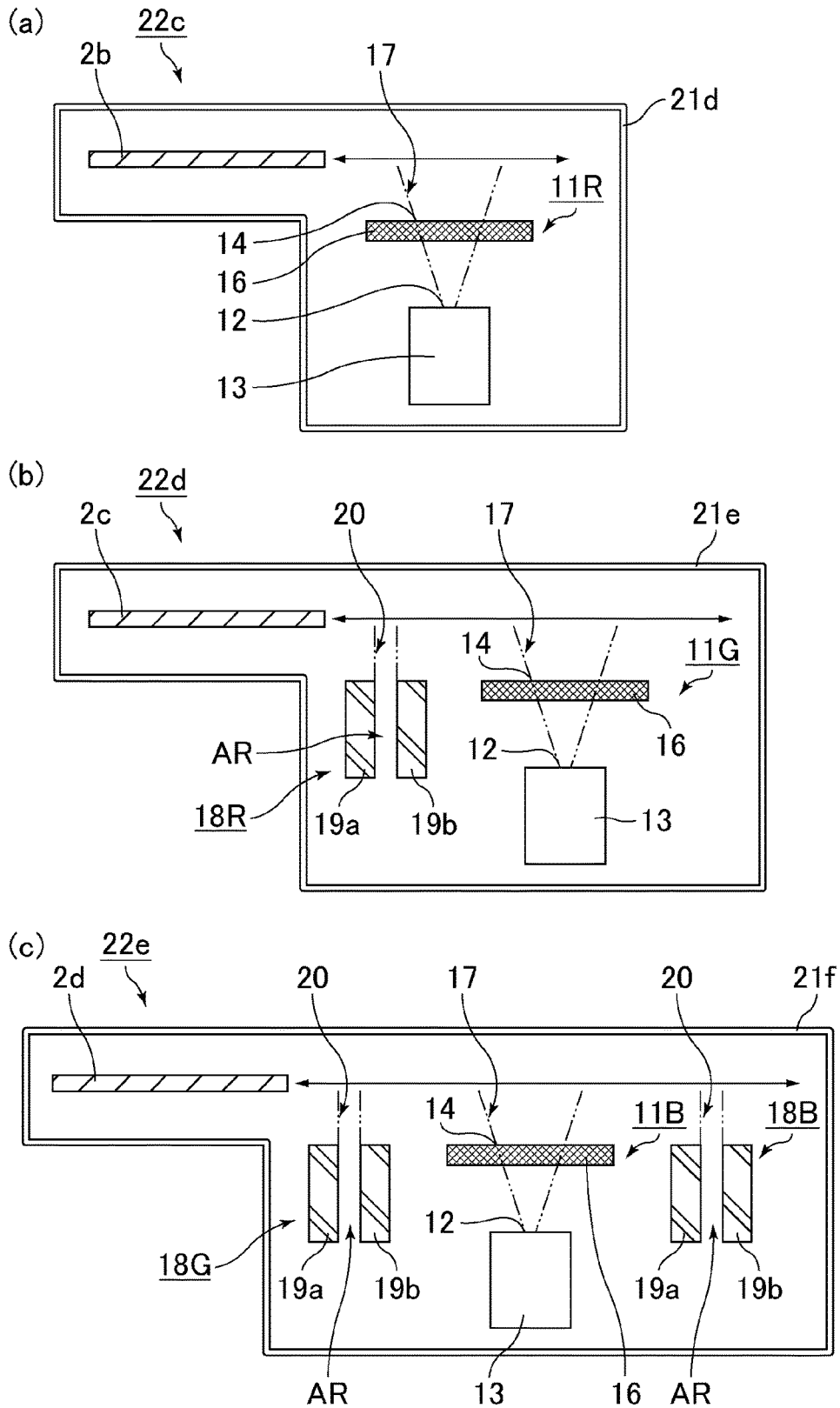
FIG. 4 is a schematic cross-sectional view illustrating an apparatus unit used in the steps (steps a to c) of forming light-emitting layers in production of an organic EL display panel of Embodiment 3.

FIG. 4 is a schematic cross-sectional view illustrating an apparatus unit used in the steps (steps a to c) of forming light-emitting layers in production of an organic EL display panel of Embodiment 3. First, the treatment is performed using an apparatus unit 22c as illustrated in the step (a) of FIG. 4. The apparatus unit 22c includes, in a chamber 21d, a vapor deposition apparatus 11R for the luminescent material of the luminescent color R. In such an apparatus unit 22c, the luminescent material of the luminescent color R is vapor-deposited by the vapor deposition apparatus 11R while a target substrate 2b is moved in the directions of the arrow.

Next, treatments are performed using an apparatus unit 22d as illustrated in the step (b) of FIG. 4. The apparatus unit 22d includes in the given order, in a chamber 21e, a plasma treatment apparatus 18R for the luminescent material of the luminescent color R and a vapor deposition apparatus 11G for the luminescent material of the luminescent color G. In such an apparatus unit 22d, the etching treatment is performed by the plasma treatment apparatus 18R while a target substrate 2c on which the luminescent material of the luminescent color R is vapor-deposited is moved in the directions of the arrow, and thereafter, the luminescent material of the luminescent color G is vapor-deposited by the vapor deposition apparatus 11G.

Finally, treatments are performed using an apparatus unit 22e as illustrated in the step (c) of FIG. 4. The apparatus unit 22e includes in the given order, in a chamber 21f, a plasma treatment apparatus 18G for the luminescent material of the luminescent color G, a vapor deposition apparatus 11B for the luminescent material of the luminescent color B, and a plasma treatment apparatus 18B for the luminescent material of the luminescent color B. In such an apparatus unit 22e, while a target substrate 2d on which the luminescent material of the luminescent color G is vapor-deposited is moved in the directions of the arrow, the etching treatment is performed by the plasma treatment apparatus 18G, the luminescent material of the luminescent color B is vapor-deposited by the vapor deposition apparatus 11B, and then the etching treatment is performed by the plasma treatment apparatus 18B. In this manner, the light-emitting layers of the three luminescent colors (R, G, B) are formed. The configurations of the vapor deposition apparatuses 11R, 11G, and 11B are the same as the configuration of the vapor deposition apparatus 11 already described with reference to FIG. 1. The configurations of the plasma treatment apparatuses 18R, 18G, and 18B are the same as the configuration of the plasma treatment apparatus 18a already described with reference to FIG. 1.

Since the flow of the step of forming light-emitting layers here is the same as that in Embodiment 1, the method for producing an organic EL display panel of Embodiment 3 of course achieves the effects of the present invention. As well as those effects, the method for producing the organic EL display panel of Embodiment 3 can further achieve the following additional effects.

As to the step of forming light-emitting layers, since contaminants may be adhering to the layers (e.g. hole transport layer 8) which have already been formed before the light-emitting layers, formation of the light-emitting layers in this state may allow the contaminants to deteriorate the luminance. In this respect, the method for producing the organic EL display panel of Embodiment 3 employing the apparatus unit 22d can vapor-deposit the luminescent material of the luminescent color G using the vapor deposition apparatus 11G immediately after removal of the contaminants adhering to the hole transport layer 8 using the plasma treatment apparatus 18R. The method employing the apparatus unit 22e can also vapor-deposit the luminescent material of the luminescent color B using the vapor deposition apparatus 11B immediately after removal of the contaminants adhering to the hole transport layer 8 using the plasma treatment apparatus 18G. As a result, the method can prevent deterioration of the luminance caused by contamination.

Embodiment 4 describes the case where the vapor deposition and the etching treatment of the luminescent materials are performed in separate chambers, and a plasma treatment apparatus of a different type from those in Embodiments 1 to 3 is used. Embodiment 4 is the same as Embodiment 1 except for the configuration of the apparatus unit used in the step of forming light-emitting layers and use of a plasma treatment apparatus of a different type. Hence, the same points are not described here.

Figure 5:
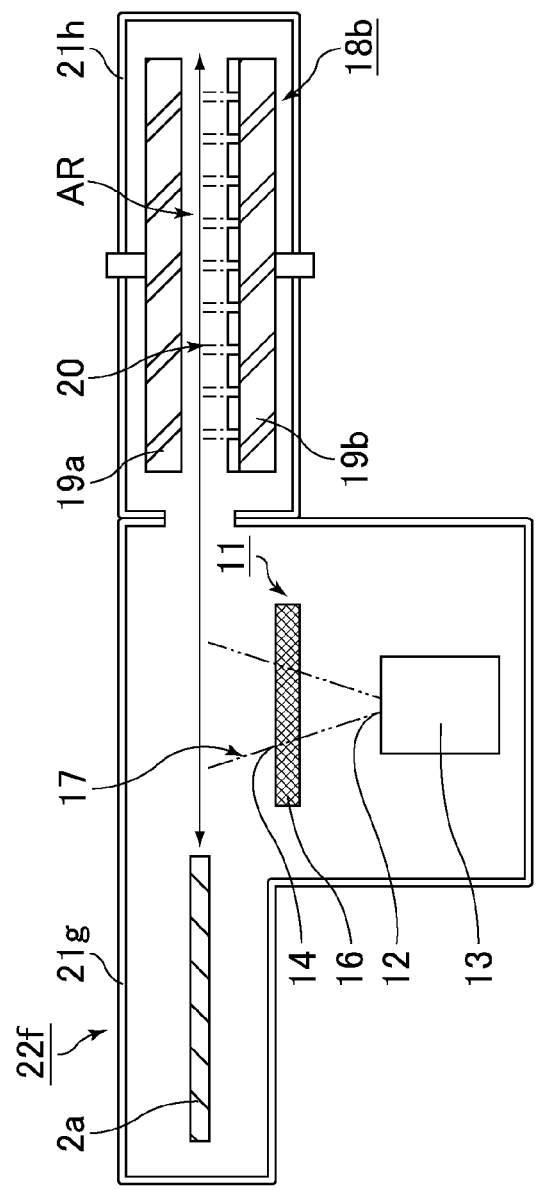
FIG. 5 is a schematic cross-sectional view illustrating an apparatus unit used in the step of forming light-emitting layers in production of an organic EL display panel of Embodiment 4.
Figure 6:
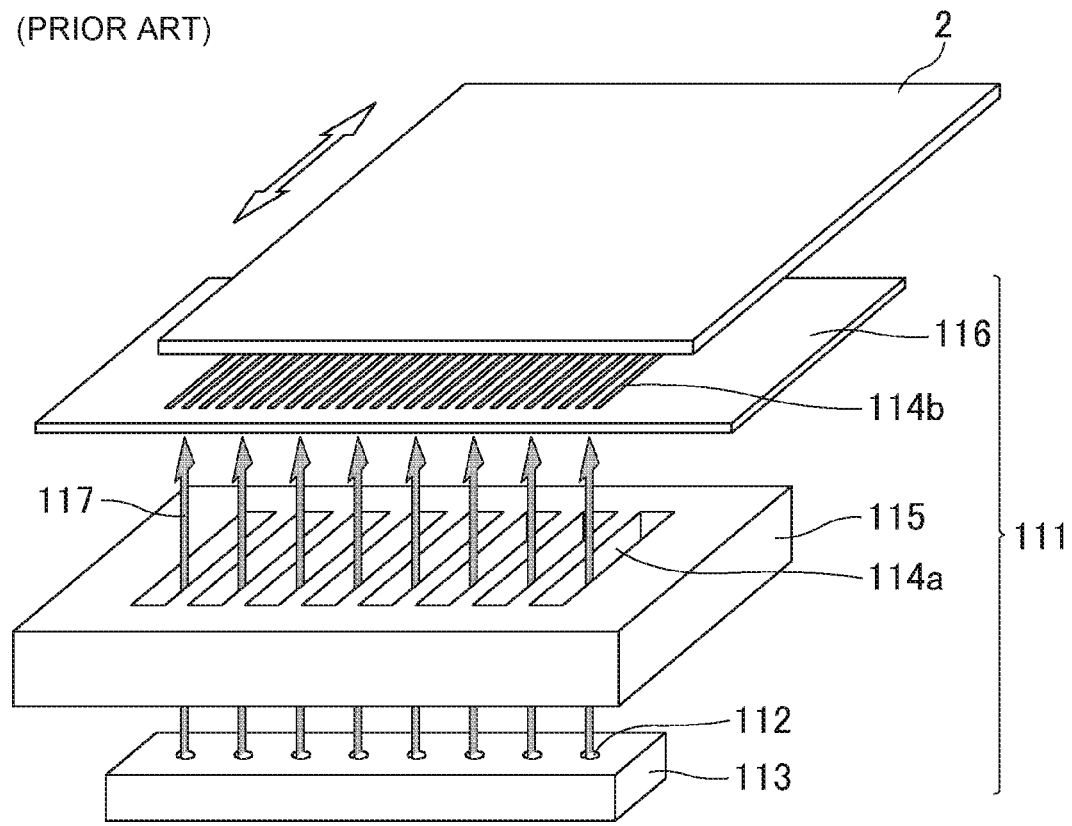
FIG. 6 is a schematic view illustrating one example of a conventional vapor deposition apparatus.
Figure 7:
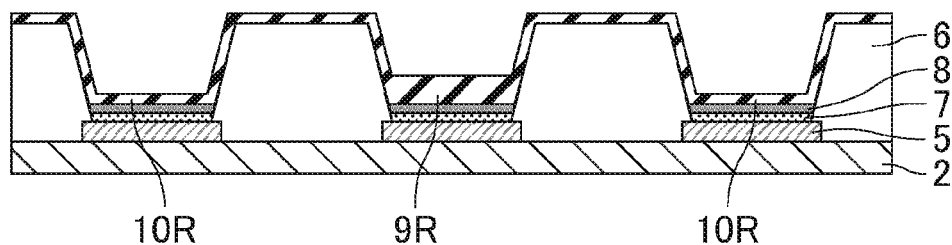
FIG. 7 is a schematic cross-sectional view illustrating the steps (steps a to c) of forming light-emitting layers in conventional production of an organic EL display panel.
Figure 7:
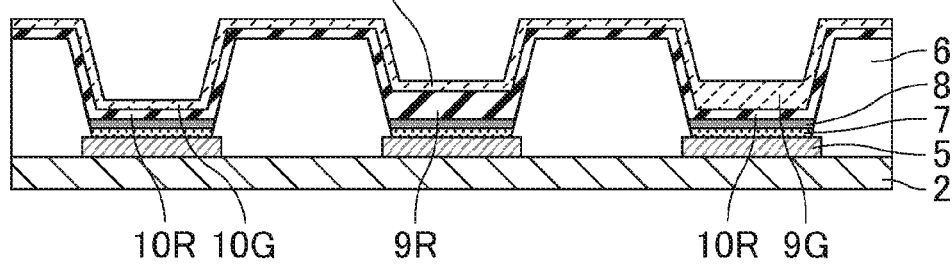
Figure 7:
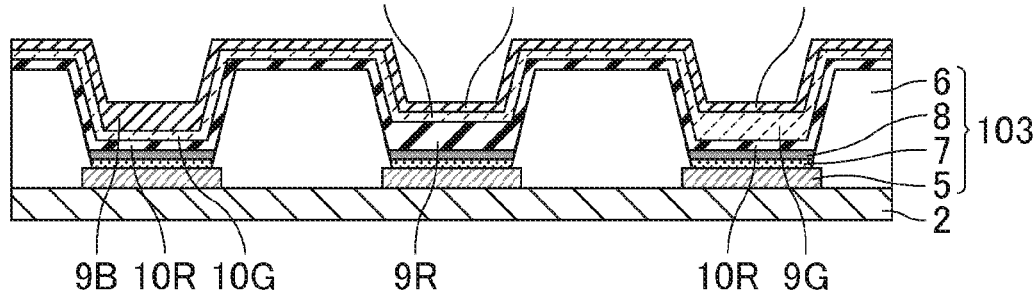

FIG. 5 is a schematic cross-sectional view illustrating an apparatus unit used in the step of forming light-emitting layers in production of an organic EL display panel of Embodiment 4. As illustrated in FIG. 5, an apparatus unit 22f used in the step of forming light-emitting layers includes the vapor deposition apparatus 11 and a plasma treatment apparatus 18b. The vapor deposition apparatus 11 and the plasma treatment apparatus 18b are disposed respectively in chambers 21g and 21h. The chambers 21g and 21h are divided by a shutter (not illustrated), for example, so that the apparatus unit 22f can move the target substrate 2a between the chambers 21g and 21h without allowing the substrate to be out of the chambers. By performing the respective treatments (vapor deposition and etching) while moving the target substrate 2a in the directions of the arrow in the apparatus unit 22f, light-emitting layers are formed. There are three apparatus units 22f for the respective luminescent colors. Sequentially performing the treatments in these three apparatus units, i.e., alternately performing the vapor deposition and the etching treatment three times, enables formation of light-emitting layers of three (R, G, B) luminescent colors.

The plasma treatment apparatus 18b includes the pair of electrodes 19a and 19b, and is configured to perform the etching treatment on the entire surface of the substrate after the vapor deposition by irradiating the entire surface of the substrate after the vapor deposition collectively with the plasma 20 in the electric discharge space AR formed by electric discharge between the pair of electrodes. Even when the plasma treatment apparatus 18b is used, since the entire surface of the substrate after the vapor deposition is etched, a selective etching treatment with a tool such as a mask and an advanced alignment technique for the selective etching treatment are not necessary. Hence, the production efficiency can be improved.

Since the flow of the step of forming light-emitting layers here is the same as that in Embodiment 1, the method for producing an organic EL display panel of Embodiment 4 of course achieves the effects of the present invention.

The plasma treatment apparatus 18b can also be used in place of the plasma treatment apparatus 18a in Embodiments 1 to 3.

As described in each embodiment above, the method for producing an organic EL display panel of the present invention is suitable for the case of vapor deposition using a vapor deposition apparatus as already described with reference to FIG. 1 in formation of films from luminescent materials. Still, the method can be employed in the cause of forming films by a technique other than vapor deposition. Although a plasma treatment apparatus is used in the etching treatment on the entire surface of the substrate on which a film of the luminescent material is formed, any other etching treatment that etches the entire surface of the substrate may be used.

Hereinafter, examples of the preferred modes of the method for producing an organic EL display panel of the present invention are described. The examples may be appropriately combined within the spirit of the present invention.

In each of the step (2) and the step (4), the thickness to be removed by the etching treatment may correspond to the thickness of the thin film. Thereby, the influence of the etching treatment on the first and second light-emitting layers can be minimized.

The step (1) and the step (2) may be performed in separate chambers and the step (3) and the step (4) may be performed in separate chambers. Thereby, the film formation in the above step (1) can be performed without an influence from the apparatus used in the step (2), and thus the first light-emitting layer can be suitably formed in the first pixel. Also, the film formation in the above step (3) can be performed without an influence from the apparatus used in the step (4), and thus the second light-emitting layer can be suitably formed in the second pixel.

The step (2) and the step (3) may be performed in the same chamber. Thereby, when contaminants adhere to the layers already formed before the second light-emitting layer, the second light-emitting layer can be formed in the step (3) immediately after removal of the contaminants in the step (2). As a result, the method can prevent deterioration of the luminance caused by contamination.

The etching treatment in each of the step (2) and the step (4) may be performed using a plasma treatment apparatus that is provided with a pair of electrodes. Thereby, the etching treatment can be suitably performed by utilizing the effect of the plasma treatment.

The plasma treatment apparatus may perform the plasma treatment by irradiating a target substrate with plasma from an electric discharge space formed by the pair of electrodes. The plasma treatment apparatus may perform the plasma treatment by irradiating the entire surface of a target substrate collectively with plasma in an electric discharge space formed by the pair of electrodes. Thereby, plasma treatment apparatuses of various types can be effectively used.

In each of the step (1) and the step (3), the film may be formed while a target substrate or a vapor deposition apparatus is relatively moved, the vapor deposition apparatus including a vapor deposition source that is provided with nozzles configured to eject vapor deposition particles and a mask provided with openings. Thereby, the method of the present invention can be suitable especially for the case of producing large-sized organic EL display panels.

REFERENCE SIGNS LIST 1, 101: organic EL display panel
2: substrate
2a, 2b, 2c, 2d: target substrate
3, 103: organic EL element
4R, 4G, 4B: pixel
5: anode
6: edge cover
7: hole injection layer
8: hole transport layer
9R, 9G, 9B: light-emitting layer
10R, 10G, 10B: thin film
11, 11R, 11G, 11B, 111: vapor deposition apparatus
12, 112: nozzle
13, 113: vapor deposition source
14, 114a, 114b: opening
115: limiting plate
16, 116: mask
17, 117: vapor deposition stream 18a, 18b, 18R, 18G, 18B: plasma treatment apparatus
19a, 19b: electrode
20: plasma
21a, 21b, 21c, 21d, 21e, 21f, 21g, 21h: chamber
22a, 22b, 22c, 22d, 22e, 22f: apparatus unit
AR: electric discharge space

The invention claimed is:

1. A method for producing an organic electroluminescent display panel, which forms a first light-emitting layer of a first luminescent material of a first luminescent color in a first pixel, which comprises a first electrode, and forms a second light-emitting layer of a second luminescent material of a second luminescent color different from the first luminescent color in a second pixel, which comprises a second electrode and is adjacent to the first pixel,
the method comprising, in the given order, the steps of:
(1) forming the first light-emitting layer by forming a first film from the first luminescent material of the first luminescent color in the first pixel and forming a first thin film of the first luminescent material of the first luminescent color which adhered to the second pixel, a thickness of the first thin film directly on a top surface of the second electrode being thinner than a thickness of the first film directly on a top surface of the first electrode;
(2) performing a first etching treatment to a region including the first and second pixels to remove the first thin film while leaving the first light-emitting layer to remain;
(3) forming the second light-emitting layer by forming a second film from the second luminescent material of the second luminescent color in the second pixel; and
(4) performing a second etching treatment to the region including the first and second pixels to remove, while leaving the second light-emitting layer to remain, a second thin film of the second luminescent material of the second luminescent color which adhered to the first pixel in the step (3) and is thinner than the second film.

2. The method for producing the organic electroluminescent display panel of claim 1,
wherein in the step (2), a first thickness to be removed by the first etching treatment corresponds to the thickness of the first thin film directly on the top surface of the second electrode, and
in the step (4), a second thickness to be removed by the second etching treatment corresponds to a thickness of the second thin film.

3. The method for producing the organic electroluminescent display panel of claim 1,
wherein the step (1) and the step (2) are performed in separate chambers and the step (3) and the step (4) are performed in separate chambers.

4. The method for producing the organic electroluminescent display panel of claim 1,
wherein the step (2) and the step (3) are performed in the same chamber.

5. The method for producing the organic electroluminescent display panel of claim 1,
wherein each of the first etching treatment in the step (2) and the second etching treatment in the step (4) is performed using a plasma treatment apparatus that is provided with a pair of electrodes.

6. The method for producing the organic electroluminescent display panel of claim 5,
wherein the plasma treatment apparatus performs a plasma treatment by irradiating a target substrate with plasma from an electric discharge space formed by the pair of electrodes.

7. The method for producing the organic electroluminescent display panel of claim 5,
wherein the plasma treatment apparatus performs a plasma treatment by irradiating an entire surface of a target substrate collectively with plasma in an electric discharge space formed by the pair of electrodes.

8. The method for producing the organic electroluminescent display panel of claim 1,
wherein in the step (1), the first film is formed while a first target substrate or a first vapor deposition apparatus is relatively moved, the first vapor deposition apparatus including a first vapor deposition source that is provided with nozzles configured to eject vapor deposition particles and a first mask provided with openings, and
in the step (3), the second film is formed while a second target substrate or a second vapor deposition apparatus is relatively moved, the second vapor deposition apparatus including a second vapor deposition source that is provided with nozzles configured to eject vapor deposition particles and a second mask provided with openings.

9. The method for producing the organic electroluminescent display panel of claim 1,
wherein the first and second pixels are disposed in a substrate,
the first etching treatment in the step (2) is performed to an entire surface of the substrate after the step (1), and
by the first etching treatment in the step (2), the first light-emitting layer is etched by a thickness corresponding to the thickness of the first thin film directly on the top surface of the second electrode.

* * * * *